(12) United States Patent
Kaneko et al.

(10) Patent No.: US 7,450,417 B2
(45) Date of Patent: Nov. 11, 2008

(54) NONVOLATILE SEMICONDUCTOR MEMORY DEVICE

(75) Inventors: Seiji Kaneko, Nara (JP); Naoki Ueda, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 2 days.

(21) Appl. No.: 11/637,026

(22) Filed: Dec. 12, 2006

(65) Prior Publication Data

US 2007/0140017 A1    Jun. 21, 2007

(30) Foreign Application Priority Data

Dec. 16, 2005    (JP) ............................. 2005-363000

(51) Int. Cl.
*G11C 11/34* (2006.01)
*G11C 16/04* (2006.01)
(52) U.S. Cl. ............................. 365/185.03; 365/185.18; 365/185.23; 365/185.24
(58) Field of Classification Search ............ 365/185.03, 365/185.23, 185.24, 185.18
See application file for complete search history.

(56) References Cited

U.S. PATENT DOCUMENTS

| | | | |
|---|---|---|---|
| 5,675,537 A * | 10/1997 | Bill et al. ............... | 365/185.22 |
| 5,818,753 A | 10/1998 | Gotou | |
| 6,154,391 A * | 11/2000 | Takeuchi et al. ........ | 365/185.24 |
| 6,195,285 B1 * | 2/2001 | Yamamoto et al. ..... | 365/185.05 |
| 6,421,277 B2 | 7/2002 | Tsunesada | |
| 6,970,380 B1 * | 11/2005 | Yeh et al. ............... | 365/185.03 |
| 7,295,468 B2 * | 11/2007 | Shibata .................. | 365/185.03 |
| 2007/0064480 A1 * | 3/2007 | Kuo et al. .............. | 365/185.03 |

FOREIGN PATENT DOCUMENTS

JP    8-106793    4/1996

\* cited by examiner

*Primary Examiner*—Ly D Pham
(74) *Attorney, Agent, or Firm*—Harness, Dickey & Pierce, PLC (57) ABSTRACT

There is provided a nonvolatile semiconductor memory device capable of accelerating writing time and avoiding readout errors of information by eliminating variation in threshold voltage of unselected memory cells. In a nonvolatile semiconductor memory device having a memory cell array with memory cells capable of erasing and programming information, the memory cells store one data value selected from the same number of data values as programming distribution ranges, associated with that the electrical attribute belongs to any one of the more than one programming distribution ranges. The device comprises an erasure means for erasing the selected memory cell to be erased so that its electrical attribute belongs to a erasure distribution range not overlapping any of the programming distribution ranges and a programming means for programming an erased memory cell to be programmed so that its electrical attribute belongs to any one of the programming distribution ranges.

15 Claims, 9 Drawing Sheets

NONVOLATILE SEMICONDUCTOR MEMORY DEVICE

CROSS REFERENCE TO RELATED APPLICATION

This Nonprovisional application claims priority under 35 U.S.C. §119(a) on Patent Application No. 2005-363000 filed in Japan on 16 Dec., 2005, the entire contents of which are hereby incorporated by reference.

BACKGROUND OF THE INVENTION

1. Field of the Invention

The present invention relates to a nonvolatile semiconductor memory device, and, more specifically, to a nonvolatile semiconductor memory device having a memory cell array arranged with a plurality of memory cells that can store information as a result of changed electrical attributes and erase and program the information by electrically changing the electrical attributes.

2. Description of the Related Art

Figure 1:
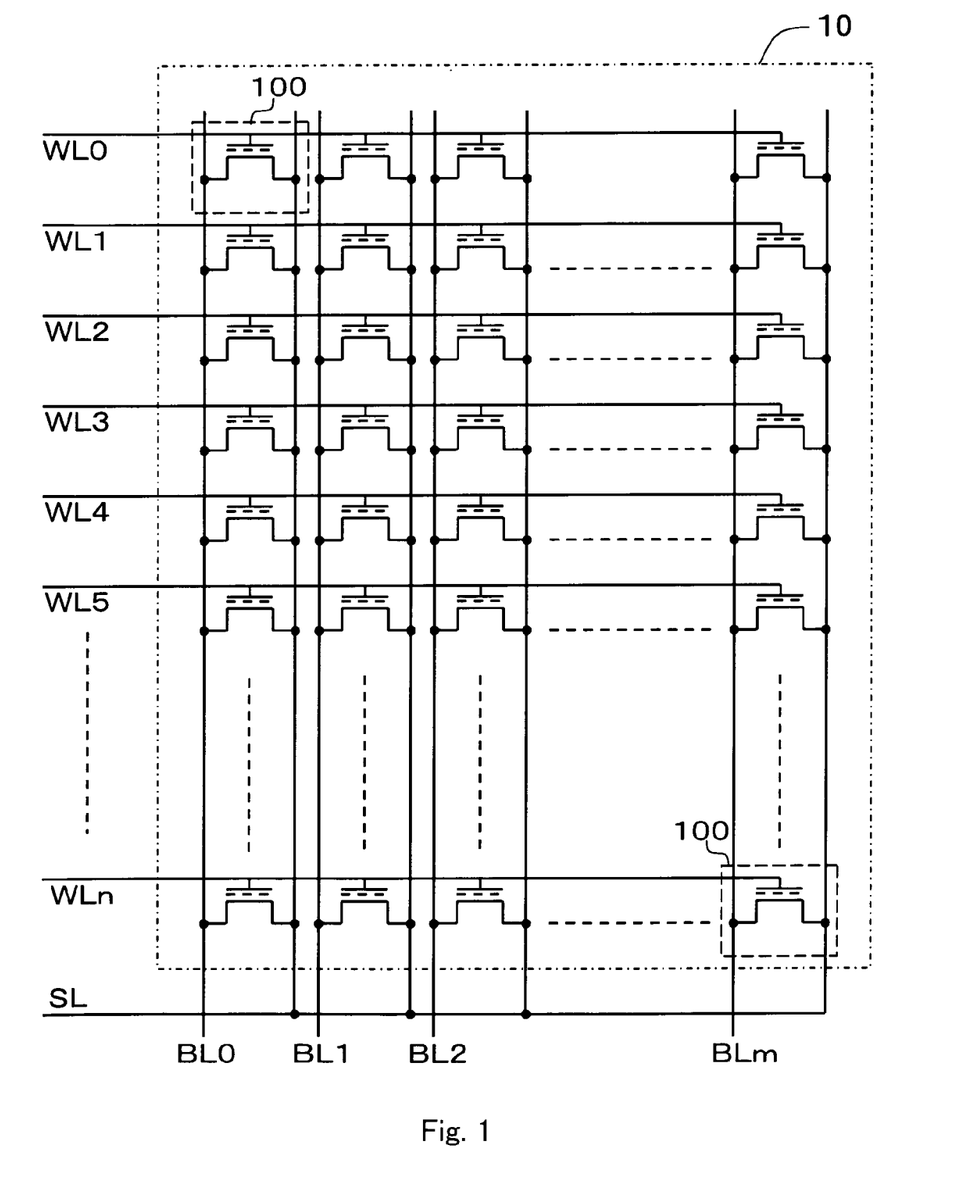
FIG. 1 is a view showing an equivalent circuit of a memory cell array of an ETOX type flash memory.
Figure 2A:
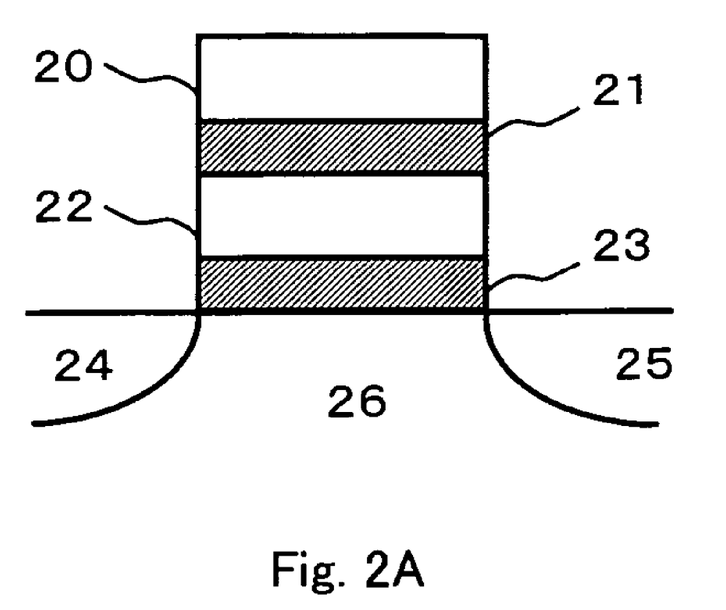
FIG. 2 is a schematic sectional view for illustrating one example of a memory cell transistor included in the memory cells, and the equivalent circuit thereof.
Figure 2B:
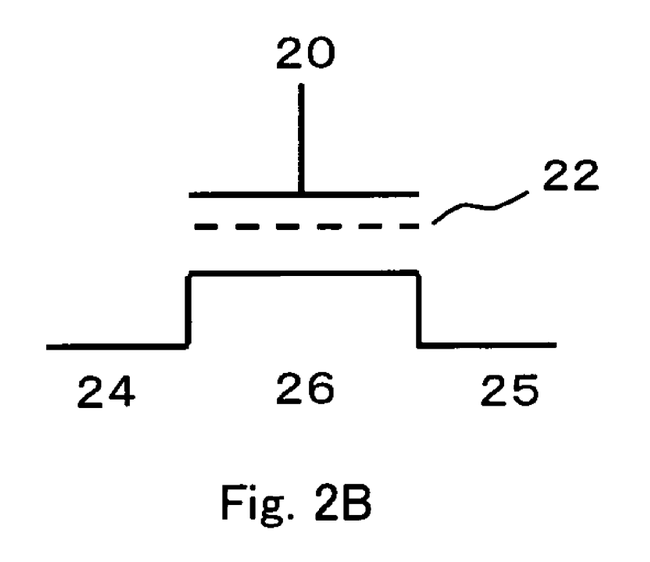

Recently, flash memories have become mainstream of nonvolatile semiconductor memory devices having a memory cell array arranged with a plurality of memory cells that can electrically erase and program information. The most general flash memories include ETOX (EPROM Thin Oxide, registered trademark of Intel Corporation) type flash memories. FIG. 1 is a view showing an equivalent circuit of a memory cell array of an ETOX type flash memory, and FIG. 2 is a schematic sectional view for illustrating one example of MOSFET included in memory cells and its equivalent circuit. A memory cell array 10 is such configured that it has memory cells 100 arranged in rows and columns like a matrix, a control gate 20 of memory cells 100 on a same row is connected to common word lines WL0 to WLn, a drain 24 of the memory cells 100 on a same column is connected to common bit lines BL0 to BLm, and a source 25 of the memory cells 100 is connected to a common source line SL.

In a MOSFET included in memory cells 100, an oxide film 23 is formed on a channel area 26 between a source 25 and a drain 24, a floating gate 22 as a charge accumulated area is formed on the oxide film 23, an inter-layer insulating film 21 is formed on the floating gate 22, and a control gate 20 is formed on the inter-layer insulating film 21. In the floating gate 22, information is programmed into and erased from the memory cells 100, by injecting and drawing electrons into/from the floating gate 22. In other words, threshold voltage of the memory cells varies, depending on how many electrons exist on the floating gate 22. Thus, for instance, such a condition that the threshold voltage of the memory cells 100 belongs to a distribution range where the threshold voltage becomes higher by injecting electrons into the floating gate 22 shall be referred to as a first condition, on the other hand, such a condition that the threshold voltage of the memory cells 100 belongs to the distribution range where the threshold voltage becomes lower by drawing electrons from the floating gate 22 shall be referred to as a second condition, to distinguish them.

However, the electron drawing speed varies depending on each memory cell 100, as memory cells 100 have such production variation as film thickness or minute defects of an oxide film 23. In fact, even though electrons were drawn in a similar manner, threshold voltage of each memory cell 100 could not be constant. Thus, if the memory cell array 10 includes (n+1)×(m+1) memory cells 100 and thus there can exist more than one memory cell 100 having different threshold voltage, the threshold voltage of the memory cells 100 will have distributions worth of the number of memory cells 100. In fact, when information is erased collectively, and if memory cells with lower electron drawing speed are in the second condition, memory cells with higher electron drawing speed will be out of the second condition. As these memory cells that are out of the second condition may cause various problems, there was need of finally eliminating them.

Thus, a flash memory for which a measure for memory cells being out of the second condition has been taken are now under study. First, memory cells in the second condition are detected and voltage is applied to the memory cells until they are in the first condition. Then, information is erased collectively so that selected memory cells that have been selected to be erased may be in the second condition.

If information is collectively erased as such, there result in memory cells that are out of the second condition due to a difference in the electron drawing speed, as described above. Thus, the memory cells that are out of the second condition should be detected by setting voltage of word lines. Then, information should be programmed back to all the memory cells connected to the bit lines by applying program back voltage to them. In addition, programming back of information could continue until the memory cells that are out of the second condition no longer exist on the bit lines, by making judgment of whether or not there is no memory cell on the bit lines that is out of the second condition.

As such, an attempt is being made to program back information by the memory cell, for the memory cells that are out of the second condition (See, for example, Japanese Laid-Open Patent Publication No. 8-106793).

Figure 7:
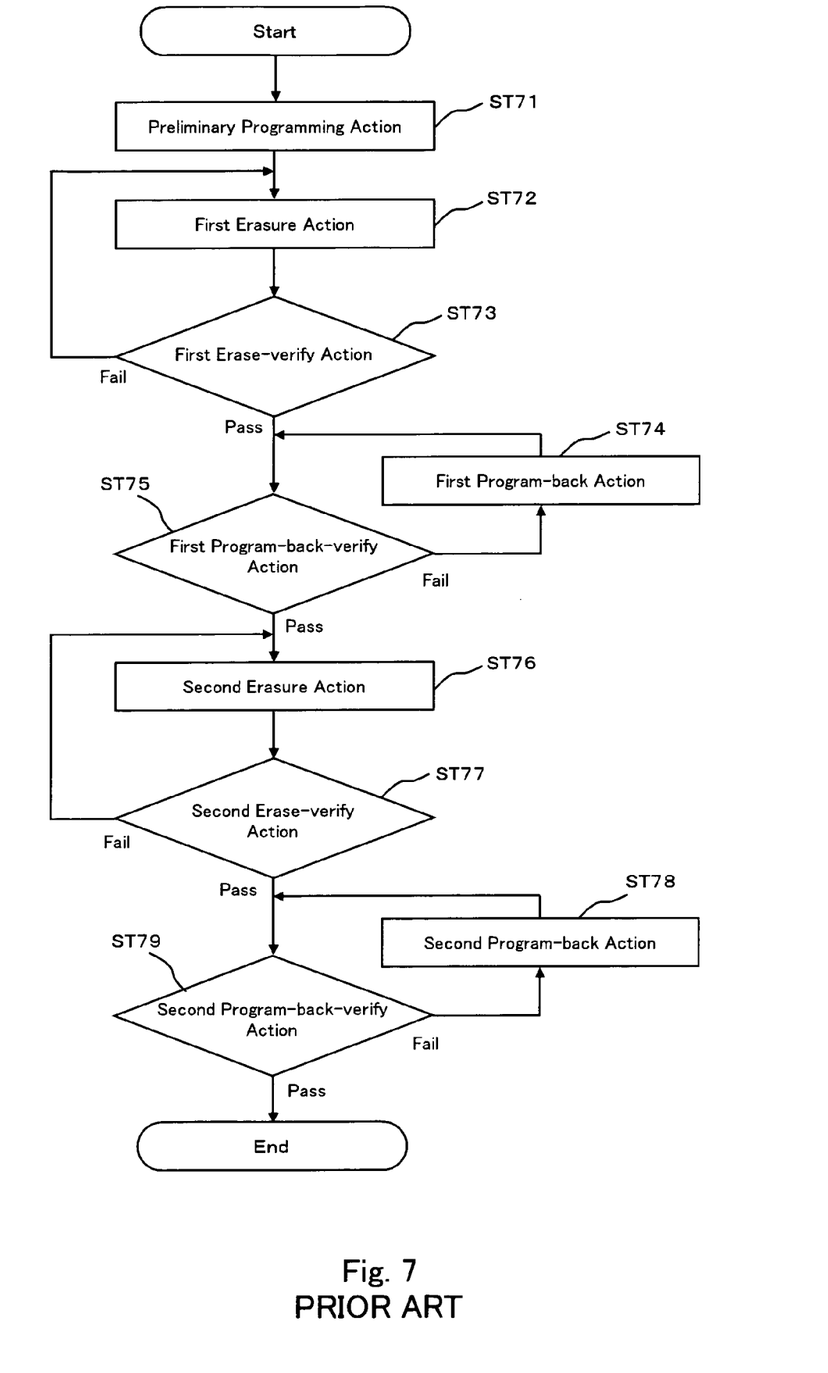
FIG. 7 is a flow chart showing the procedure of erasure action in other example of a flash memory that has taken a measure for memory cells that will not shift to the second condition of the conventional device.

In addition, FIG. 7 is a flow chart showing the procedure of erasure action in other examples of flash memories for which the measure for the memory cells that are out of the second condition have been taken.

First, memory cells in the second condition are detected and the action of preliminarily programming information to the memory cells is performed until they are in the first condition (ST 71). Next, by using "erasure judgment level 1" that has been set higher than target "erasure judgment level 2", a first erasure action of information of selected memory cells that have been selected as target cells of erasing is performed (ST 72). Then, the first erasure action continues until it is judged that the threshold voltage of the memory cells is below the "erasure judgment level 1" (hereinafter abbreviated as "first erase-verify action", as appropriate) (ST 73). Then, the first program-back action is performed (ST 74) until it is judged that the threshold voltage of the memory cells is higher than or equal to "program-back judgment level 1" (hereinafter abbreviated as "first program-back-verify action", as appropriate) (ST 75). Then, considering that threshold voltage of other memory cells also appears to be low due to effect of memory cells having excessively low threshold voltage, the first program-back-verify action is performed by the "program-back judgment level 1" that has been set lower than the target "program-back judgment level 2".

Thus, by performing steps ST 72 to ST 75, information is programmed back so that the memory cells having excessively low threshold voltage can have threshold voltage in a certain range. Then, as the first program-back verify action eliminates the memory cells having excessively low threshold voltage, which thus removes the phenomenon that distribution of the threshold voltage throughout the memory cell array looks dropped, distribution of real threshold voltage will be shown.

Next, using the "erasure judgment level 2", a second erasure action of erasing information of selected memory cells that have been selected to be erased is performed (ST 76). Then, the second erasure action is performed until it is judged that the threshold voltage of the memory cells is below the "erasure judgment level 2" (hereinafter abbreviated as "second erase-verify action", as appropriate) (ST 77). Then, a second program-back action is performed (ST 78) until it is judged that the threshold voltage of the memory cells is higher than the "program-back judgment level 2" (hereinafter abbreviated as "second program-back-verify action", as appropriate) (ST 79).

Thus, by performing steps ST 76 to ST 79, information can be programmed back so that the memory cells that do not shift to the second condition can shift to the second condition (See, for example, Japanese Laid-Open Patent Publication No. 2001-184876).

Figure 3:
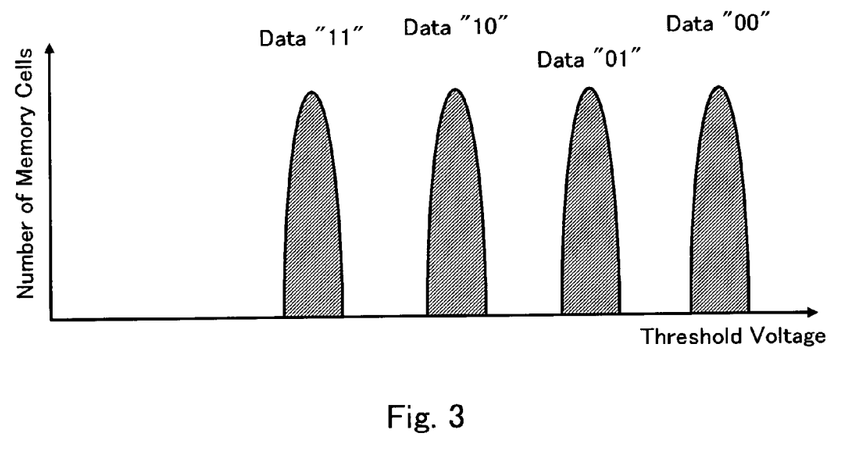
FIG. 3 is a view schematically showing one example of a distribution range of threshold voltage of memory cells in a four-valued flash memory.

In addition, in ETOX type flash memories, provision of more than two distribution ranges of threshold voltage could make it possible to implement multilevel storage, which is greater than two values, in one memory cell. FIG. 3 schematically shows one example of a distribution range of the threshold voltage of a memory cell in a four-valued flash memory. The horizontal axis represents threshold voltage of memory cells, while the vertical axis represents the number of memory cells. The distribution range of the threshold voltage are partitioned into 4 sections and set, four types of data values "11", "10", "01", "00" are assigned to the distribution ranges in ascending order of the threshold voltage.

Figure 8:
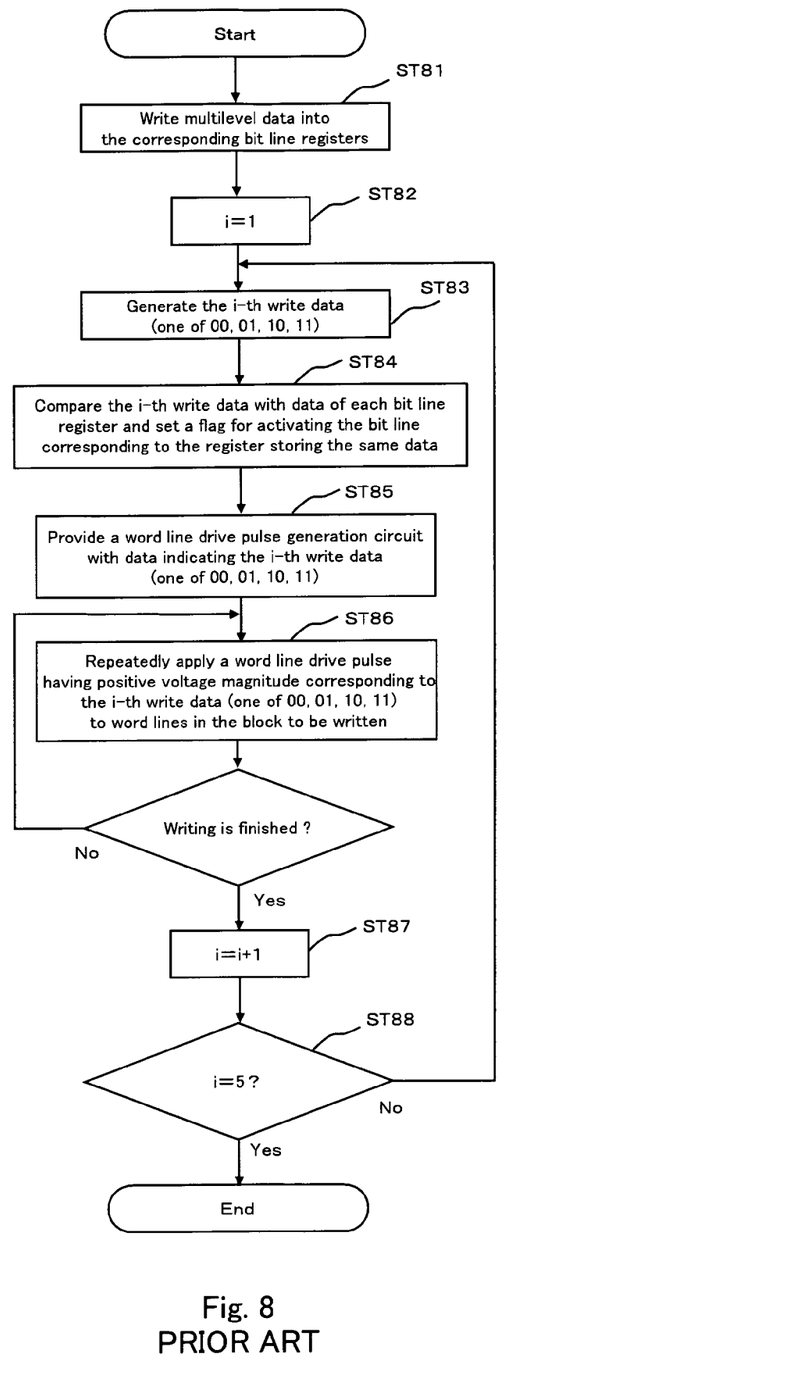
FIG. 8 is a flow chart showing the operation procedure for collectively programming four types of data values for every content in the conventional device.

Such a method of writing information of multilevel flash memory is disclosed in Japanese Laid-Open Patent Publication No. 9-45094. FIG. 8 is a flow chart showing the operation procedure in collectively writing the four types of data values, depending on content. First, a data value of a selected memory cell that has been selected as a target cell to be erased shall be set to "00". In fact, information has been programmed back so that threshold voltage of memory cells that fall outside of the distribution range corresponding to the data "00" can belong to the corresponding distribution range.

Then, a write data generating unit generates multilevel data "00", "01", "10", and "11" to be written into respective memory cells, and writes them into a bit line register (ST 81).

Next, i=1 is set in an index counter (ST 82), and the data "11" is outputted from the write data generating unit (ST 83). The outputted data "11" is sequentially compared with contents of respective registers ("00" "01", "10", or "11"). When registers that store the same data value as the data "11" are found, flags corresponding to these registers are set (ST 84). Consequently, the corresponding bit lines become activated.

Then, the write data generating unit provides a word line drive pulse generation circuit with word line drive pulse data corresponding to the data "11" (ST 85). Then, in output of the word line drive pulses, a predetermined number of the pulses are supplied from the word line drive pulse generation circuit to the word lines (ST 86). When the word line drive pulse output is applied to the corresponding word lines only for the predetermined number of pulses, writing of the data "11" to the memory cells ends. The index counter is incremented by 1 (ST 87), and the incremented index value i is checked (ST 88). If the index value i is greater than 4, writing of the four types of data values ("00", "01", "10" and "11") to the memory cells has not yet ended. In that case, writing of a next data value (for instance, "10") is performed. On the one hand, if the index value i is 5, writing of the four types of data values ("00", "01", "10", and "11") has ended (see, for example, Japanese Laid-Open Patent Publication No. 9-45094).

However, if the erasure action is performed in ETOX type flash memories described above, the program-back-verify action is performed for the memory cells from which information has been excessively erased after collective erasure so that the threshold voltage of memory cells may belong to a distribution range corresponding to a specific data value, to ensure that there will be no memory cell from which information has been excessively erased and that there will be no memory cell to which information has been excessively programmed back. Thus, the program-back time (sum of time during which program-back voltage is applied and the program-back-verify time) is needed.

Figure 9:
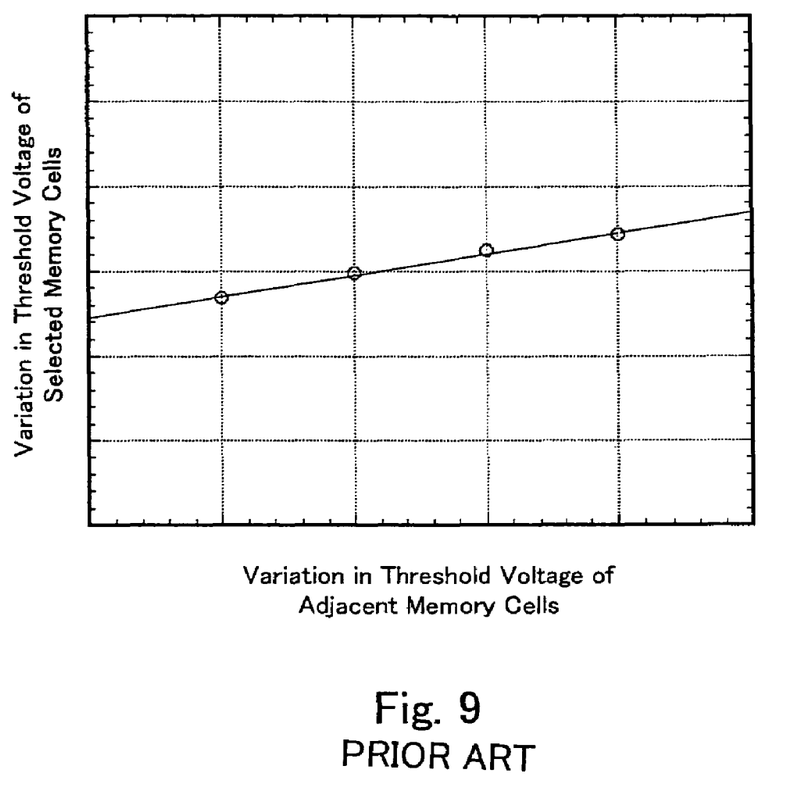
FIG. 9 is a graph showing one example of a relationship of variation in threshold voltage between selected memory cells and the adjacent memory cells.

In addition, in a method of writing information of a four-valued flash memory, writing of four types data values, including program-back by means of the erasure action, is performed. However, as memory cells become smaller with recent miniaturization, due to variation in threshold voltage of selected memory cells that are a target of writing, variation of threshold voltage of adjacent memory cells that are not a target of writing has also increased. FIG. 9 shows a graph illustrating one example of a relationship between the variation in the threshold voltage of the selected memory cells and the variation in the threshold voltage of the adjacent memory cells. Hence, when writing of information has already completed in memory cells adjacent to the selected memory cells to be written, the threshold voltage of the adjacent memory cells also vary due to the variation in the threshold of the selected memory cells, thus possibly causing a readout error when information of the adjacent memory cells is read out.

SUMMARY OF THE INVENTION

In view of this, the object of the present invention is to solve the traditional problems as described above, and to provide a nonvolatile semiconductor memory device that can accelerate time for writing (sum of time for erasure and that for programming) and that can further avoid any readout error of information by eliminating variation in threshold voltage of unselected memory cells, in a nonvolatile semiconductor memory device having a memory cell array arranged with a plurality of memory cells capable of storing information as a result of a change in electrical attributes and of erasing and programming information by electrically changing the electrical attributes.

In a nonvolatile semiconductor memory device having a memory cell array arranged with a plurality of memory cells capable of storing information as a result of a change in an electrical attribute and of erasing and programming information by electrically changing the electrical attribute, a nonvolatile semiconductor memory device of the present invention is characterized in that the memory cells can store one data value to be selected from the same number of data values as a plurality of distribution ranges for programming which are not mutually overlapping, in accordance with that the electrical attribute belongs to one of the distribution ranges for programming. The nonvolatile semiconductor memory device includes an erasure means for erasing the memory cells so that the electrical attribute of the memory cell selected as a target of erasing may belong to a distribution range for erasing that does not overlap any of the distribution ranges for programming, and a programming means for programming the memory cells so that the electrical attribute of an erased memory cell being a target of programming may belong to any one of the distribution ranges for programming.

In addition, the nonvolatile semiconductor memory device of the present invention is preferably characterized in being such configured that the erasure means erases the memory cell selected as a target of programming so that its electrical attribute may belong to the distribution range for erasing, and subsequently the programming means programs the erased memory cell so that its electrical attribute may belong to any one of the distribution ranges for programming.

In addition, the nonvolatile semiconductor memory device of the present invention is preferably characterized in that the memory cells have a floating gate that stores information depending on an amount of accumulated charge, a source, a drain, and a control gate that controls a potential level of the floating gate, each of the memory cells being arranged in rows and columns as a matrix, each control gate of the memory cells on a same row being connected to a common word line, each drain of the memory cells on a same column being connected to a common bit line, and the electrical attribute being threshold voltage of MOSFET included in the memory cells.

In addition, the nonvolatile semiconductor memory device of the present invention is preferably characterized in that either the upper limit of the distribution range for erasing is lower than or equal to the upper limit of the lowest distribution range among the distribution ranges for programming, or the lower limit of the distribution range for erasing is higher than or equal to the lower limit of the highest distribution range among the distribution ranges for programming.

In addition, the nonvolatile semiconductor device of the present invention is preferably characterized in that either the upper limit of the distribution range for erasing is lower than the upper limit of the lowest distribution range, only by variation in a threshold voltage to be given to an adjacent memory cell when programming to an erased memory cell a data value corresponding to the lowest distribution range among the distribution ranges for programming, or the lower limit of the distribution range for erasing is higher than the lower limit of the highest distribution range, only by variation in a threshold voltage to be given to an adjacent memory cell when programming to an erased memory cell a data value corresponding to the highest distribution range among the distribution ranges for programming.

In addition, the nonvolatile semiconductor memory device of the present invention is preferably characterized in that either the lower limit of the distribution range for erasing is lower than the lower limit of the lowest distribution range among the distribution ranges for programming, or the upper limit of the distribution range for erasing is higher than the upper limit of the highest distribution range among the distribution ranges for programming.

In addition, the nonvolatile semiconductor memory device of the present invention is preferably characterized in that the upper limit of the distribution range for erasing is lower than or equal to the upper limit of the lowest distribution range among the distribution ranges for programming, and the lower limit of the distribution range for erasing is lower than the lower limit of the lowest distribution range.

The nonvolatile semiconductor memory device of the present invention is preferably characterized in that the upper limit of the distribution range for erasing is lower than the upper limit of the lowest distribution range, only by variation in a threshold voltage to be given to an adjacent memory cell when programming to an erased memory cell a data value corresponding to the lowest distribution range.

The nonvolatile semiconductor memory device of the present invention is preferably characterized in that the programming means performs the program-verify action for judging whether or not the threshold voltage of the memory cell belongs to the distribution range for programming corresponding to the desired data value after applying programming voltage to all of the memory cells being a target of programming.

In addition, the nonvolatile semiconductor memory device is preferably characterized in that the programming means repeats the program-verify action and application of the programming voltage until it is judged that the threshold voltage of the memory cell being a target of programming belongs to the programming distribution range that corresponds to the desired data value.

In addition, the nonvolatile semiconductor memory device is preferably characterized in that when the erase-verify action is performed, the erasure means applies to unselected word lines to which a selected memory cell being a target of erasing is not connected voltage that is lower than or equal to the lowest threshold voltage among the threshold voltages of unselected memory cells being not a target of erasing on a selected bit line to which the selected memory cell is connected.

In addition, the nonvolatile semiconductor memory device is preferably characterized in that when the program-verify action is performed, the programming means applies to unselected word lines to which a selected memory cell being a target of the program-verify action is not connected voltage that is lower than or equal to the lowest threshold voltage among the threshold voltages of unselected memory cells being not a target of the program-verify action on a selected bit line to which the selected memory cell is connected.

In addition, the nonvolatile semiconductor memory device is preferably characterized in that when programming each data value, the programming means applies to unselected word lines to which a selected memory cell being a target of programming is not connected voltage that is lower than or equal to the lowest threshold voltage among the threshold voltages of unselected memory cells being not a target of programming on a selected bit line to which the selected memory cell is connected.

According to the device of this invention, even when there exist memory cells from which information is excessively erased after erasure, the information is programmed to all the memory cells being a target of programming, and thus there is no need of programming back information to the memory cells from which information is excessively erased, thereby enabling acceleration of writing time.

In addition, since programming is performed so that the electrical attributes of all the memory cells being a target of programming may belong to any one of the distribution ranges for programming after erasing is performed so that the electrical attribute of the memory cell may belong to the distribution range for erasing, it is possible to eliminate extreme variation in the electrical attribute of the memory cell belonging to the distribution range corresponding to the specific data value, and consequently any readout error of the information can be avoided. Specifically, if the electrical attribute is threshold voltage, effect of variation in the threshold voltage between adjacent memory cells as described above can be avoided.

Furthermore, since it is judged whether or not the threshold voltage of the memory cell belongs to the distribution range for programming that corresponds to the desired data value, after the programming voltage is applied to all memory cells being a target of programming, any offset of the threshold voltage in unselected memory cells can be eliminated, consequently, the readout error of the information can be avoided.

DETAILED DESCRIPTION OF THE INVENTION

In the following, based on the drawings, we describe embodiments of a nonvolatile semiconductor memory device (hereinafter abbreviated as the "device of this invention" as appropriate) according to the present invention.

Figure 4:
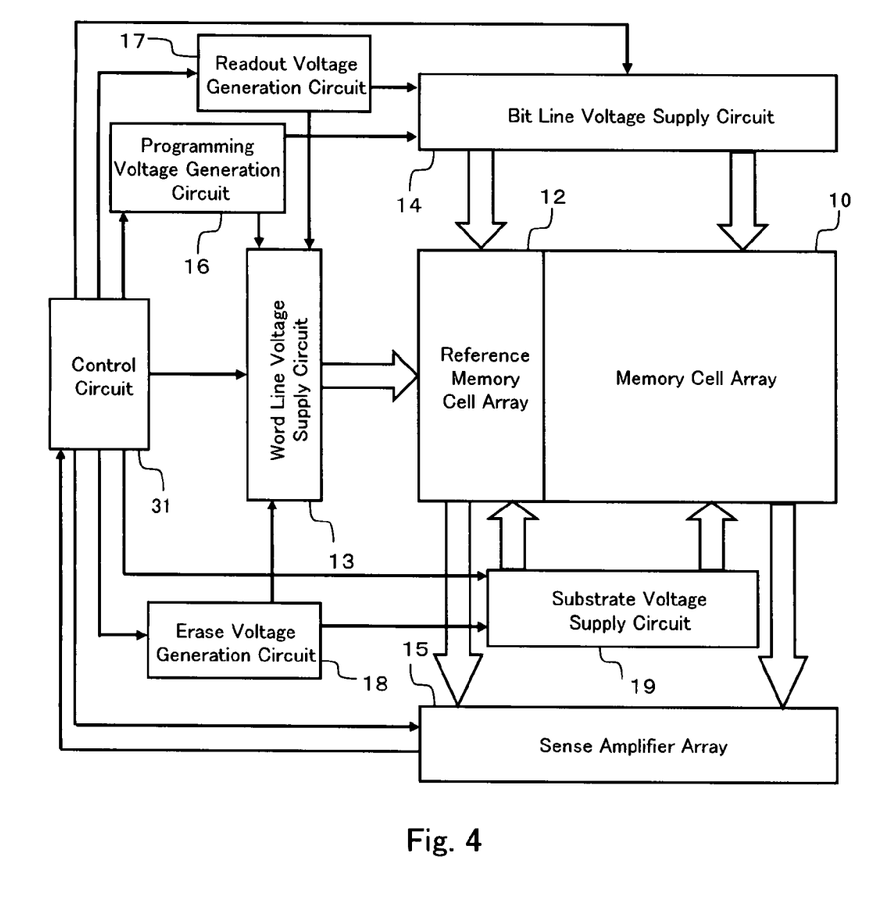
FIG. 4 is a block diagram showing schematic functional configuration of the device of the present invention.

FIG. 4 is a block diagram showing schematic functional configuration of the device of this invention. FIG. 4 does not describe details of an input circuit for a plurality of address input signals, a plurality of data input signals, a plurality of control signals, etc., an output circuit for a plurality of data output signals, etc., a peripheral circuit such as a decoder circuit for address input signals, etc., as they are similar to those of a nonvolatile semiconductor memory device such as known flash memories, etc. Thus, FIG. 4 mainly describes circuit sections associated with a writing action of information by the memory cell array 10.

The device of this invention includes a memory cell array 10, a reference memory cell array 12, a word line voltage supply circuit 13 for supplying word line voltage to word lines of the memory cell array 10 and the reference memory cell array 12, a bit line voltage supply circuit 14 for supplying bit line voltage to bit lines of the memory cell array 10 and the reference memory cell array 12, a substrate voltage supply circuit 19 for supplying source line voltage to source lines of the memory cell array 10 and the reference memory cell array 12, and a sense amplifier array 15 including a plurality of sense amplifiers for verifying information of selected plurality of memory cells 100 of the memory cell array 10 by comparing readout voltage that is read from selected bit lines of the memory cell array 10 with reference voltage that is read from selected bit lines of the reference memory cell array 12.

The reference memory cell array 12 includes an arrangement of a plurality of memory cells 100, as with the memory cell array 10. In addition, the word lines of the reference memory cell array 12 are shared by those of the memory cell array 10. Furthermore, memory cells 100 in respective columns of the reference memory cell array 12 have been programmed in advance to have predetermined threshold voltage for readout, for program-verify, and for erase-verify.

In addition, the device of this invention includes a programming voltage generation circuit 16, a readout voltage generation circuit 17, an erase voltage generation circuit 18, and a control circuit 31.

The control circuit 31 receives a programming signal from the external, and performs control of the circuits 13 to 19, setup of the word line and bit line voltage, selection of selected memory cells to which the bit line voltage is applied, etc. In addition, the control circuit 31 receives a signal from a sense amplifier array 15 and makes judgment during a verify action, or outputs a signal to external output terminals during a readout action.

Under the control of the control circuit 31, the word line voltage supply circuit 13 supplies selected word lines with programming gate voltage generated by the programming voltage generation circuit 16 during a programming action, supplies the selected word lines with verify gate voltage generated by the readout voltage generation circuit 17 during a verify action, and supplies the selected word lines with erase gate voltage generated by the erase voltage generation circuit 18 during an erase action.

Under the control of the control circuit 31, the bit line voltage supply circuit 14 supplies the selected bit lines with program drain voltage generated by the programming voltage generation circuit 16 during a programming action, and supplies the selected bit lines with verify drain voltage generated by the readout voltage generation circuit 17 during a verify action. In addition, under the control of the control circuit 31, the substrate voltage supply circuit 19 supplies the selected source lines with erase drain voltage generated by the erase voltage generation circuit 18 during an erase action.

Figure 5:
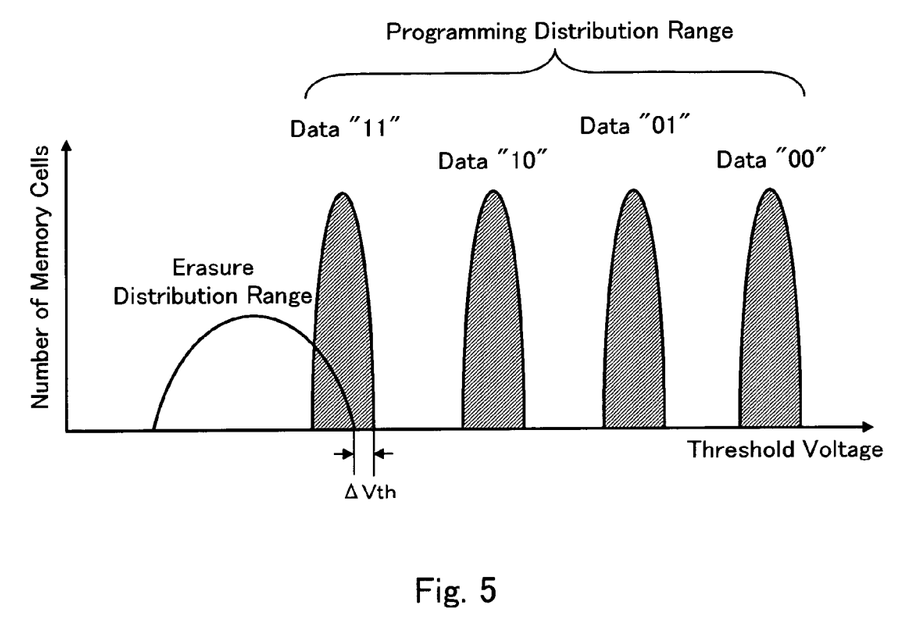
FIG. 5 is a view schematically showing one example of a distribution range of threshold voltage of the memory cells in the device of the present invention.

We describe a case where the device of this invention stores 4 types of data values. As shown in FIG. 5, the programming distribution range is divided into 4 sections to which 4 types of data values "11", "10", "01" and "00" are assigned in turn, starting with the programming distribution range with the lowest threshold voltage. In addition, the upper limit of the erasure distribution range shall be below that of the programming distribution range corresponding to data "11" (hereinafter abbreviated as "'11' distribution range", as appropriate), and the lower limit of the erasure distribution range shall be lower than that of the programming distribution range corresponding to data "11". In addition, it is preferable that the upper limit of the erasure distribution range is lower than that of the "11" distribution range, only by variation in the threshold voltage $\Delta Vth$ that is to be given to adjacent memory cells when the data "11" is programmed into erased memory cells.

Figure 6:
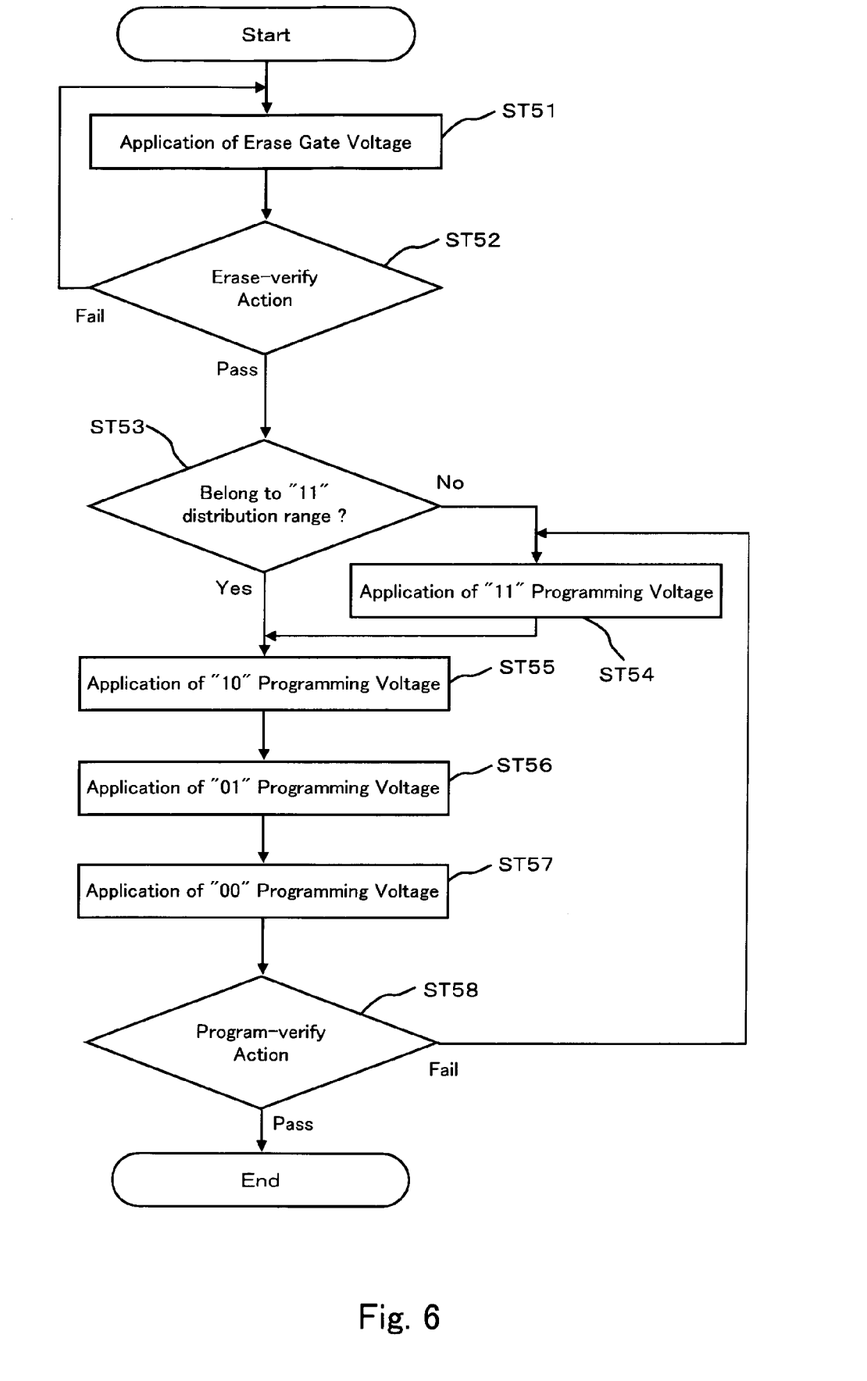
FIG. 6 is a flow chart showing one example of a method of writing four types of data values in the device of the present invention.

Next, with reference to FIG. 6, we describe one example of a method of writing the 4 types of data values in the device of this invention.

(1) Erasure

First, the word line voltage supply circuit 13 applies to respective word lines corresponding to selected memory cell arrays to be erased, the erase gate voltage (e.g., "−10V") generated by the erase voltage generation circuit 18. It also supplies erase-well voltage (e.g., "8V") to common wells corresponding to the selected memory cell arrays to be erased. In addition, it not only makes drains of respective memory cells in the selected memory cell array open, but also makes sources of the respective memory cells open. This allows information in all the memory cells in the selected memory cell array to be erased (ST 51). Then, information is gradually erased by intermittently repeating the erasure action of predetermined unit time. Thus, the erase verify action takes place, every erase action of the unit time (ST 52). Then, information is erased by repeating the erase-verify action and application of the erase gate voltage, until it is judged that the threshold voltage of all the memory cells in the selected memory cell array belongs to the erasure distribution range.

Then, during the erase-verify action, word line voltage equal to the upper limit of the erasure distribution range is supplied to the control gate of the erase-verify reference cell so that current having the current amount Iref may run through the reference cell. Then, if the threshold voltage of the selected memory cells being a target of the erase-verify action is lower than or equal to the upper limit of the erasure distribution range, the selected memory cells will turn ON, and thus the current having the current amount corresponding to the word line voltage will run through the bit lines. On the one hand, if the threshold voltage of the selected memory cells is higher than the upper limit of the erasure distribution range, the selected memory cells will turn OFF, and thus the current will not flow through the bit lines.

If information of unselected memory cells on the selected bit line to which the selected memory cells to be subjected to the erase-verify are also connected is excessively erased (the word line voltage to which the unselected memory cells are connected is higher than or equal to the threshold voltage of the unselected memory cells), current will run through the selected bit lines. In fact, it will be recognized as if the selected memory cells are turned ON. Thus, in order to avoid this, the device of this invention always maintains the word line voltage of the unselected memory cells lower than or equal to the threshold voltage of the unselected memory cells (e.g., "−3V").

As such, if the current amount running through the bit lines is grater than or equal to the current amount Iref, the control circuit 31 considers that the threshold voltage of the selected memory cell belongs to the erasure distribution range, and performs similar erase-verify action on a next selected memory cell. On the one hand, if the current amount through the bit line is less than the current amount Iref, it means that there are some memory cells that have not been adequately erased. Thus, the control circuit repeats application of the erase gate voltage and the erase-verify action. If it is judged that with this repetition, all the memory cells in the selected memory cell array to be erased belong to the erasure distribution range, erasure ends. In the device of this invention, no information is programmed back to the memory cells.

(2) Programming

First, data "11" is programmed so that threshold voltage of the selected memory cell to be programmed into "11" may fall within the "11" distribution range. Then, the threshold voltage of the selected memory cell belongs to the erasure distribution range. First, before programming voltage is applied, it is judged whether or not the threshold voltage of the selected memory cell belongs to the "11" distribution range (program-verify action) (ST 53). Then, in order to avoid effect of memory cells in which excessive erasure has taken place, voltage of unselected word line is kept lower than or equal to the threshold voltage of the unselected memory cells during the program-verify action. In addition, the word line voltage equal to the lower limit of the "11" distribution range is supplied to the control gate of the "11" verify reference cell, so that the current having the current amount Iref can run through the reference cell.

Thus, if amount of the current running through the bit lines is below the current amount Iref, the control circuit 31 considers that the threshold voltage of the selected memory cell belongs to the "11" distribution range, and the program-verify action passes. On the one hand, if the amount of the current running through the bit line exceeds the current amount Iref, the threshold voltage of the selected memory cell has not reached the lower limit of the "11" distribution range, and thus "11" programming voltage is applied (ST 54). Specifically, while the program gate voltage (e.g., "5V") is applied to the word line to which the selected memory cell to be programmed is connected, the program drain voltage (e.g., "5V") is supplied to the bit line to which the selected memory cell to be programmed is connected, and the source of the memory cell is set to 0V. Then, the program-verify action should not be performed on the selected memory cell after the programming voltage is applied.

Next, "10" programming voltage is applied to the selected memory cell so that the threshold voltage of the selected memory cell to be programmed into "10" may fall within the programming distribution range corresponding to data "10" (hereinafter abbreviated as "'10' distribution range", as appropriate) (ST 55). Then, the threshold voltage of the selected memory cell belongs to the erasure distribution range. A programming pulse (e.g., 1 μs) is applied to this selected memory cell without performing the program-back-verify action. Specifically, not only the program gate voltage (e.g., "6.5V") is applied to the word line to which the selected memory cell to be programmed is connected, but also the program drain voltage (e.g., "5V") is supplied to the bit line to which the selected memory cell to be programmed is connected, and the source of the memory cell is set to 0V. Then, the program-verify action is not performed on the selected memory cell.

Next, "01" programming voltage is applied to the selected memory cell so that the threshold voltage of the selected memory cell to be programmed into "01" may fall within the programming distribution range corresponding to data "01" (hereinafter abbreviated as "'01' distribution range", as appropriate) (ST 56). Then, the threshold voltage of the selected memory cell belongs to the erasure distribution range. A programming pulse (e.g., 1 μs) is applied to this selected memory cell without performing the program-back-verify action. Specifically, while the program gate voltage (e.g., "8V") is applied to the word line to which the selected memory cell to be programmed is connected, the program drain voltage (e.g., "5V") is supplied to the bit line to which the selected memory cell to be programmed is connected, and the source of the memory cell is set to 0V. Then, the program-verify action is not performed on the selected memory cell.

Next, "00" programming voltage is applied to the selected memory cell so that the threshold voltage of the selected memory cell to be programmed into "00" may fall within the programming distribution range corresponding to data "00" (hereinafter abbreviated as "'00' distribution range", as appropriate) (ST 57). Then, the threshold voltage of the selected memory cell belongs to the erasure distribution range. A programming pulse (e.g., 1 μs) is applied to this selected memory cell without performing the program-back-verify action. Specifically, while the program gate voltage (e.g., "10V") is applied to the word line to which the selected memory cell to be programmed is connected, the program drain voltage (e.g., "5V") is supplied to the bit line to which the selected memory cell to be programmed is connected, and the source of the memory cell is set to 0V. Then, the program-verify action is not performed on the selected memory cell.

(3) Program-verifying

First, it is judged whether or not the threshold voltage of the selected memory cell to be programmed into "11" belongs to the "11" distribution range. Then, during the program-verify action, the unselected word line voltage shall be lower than or equal to the threshold voltage of the unselected memory cell. In addition, the word line voltage equal to the lower limit of the "11" distribution range is supplied to the control gate of the verify reference cell, so that current having the current amount Iref may run through the reference cell.

Next, it is judged whether or not the threshold voltage of the selected memory cell to be programmed into "10" belongs to the "10" distribution range. Then, during the program-verify, voltage of the unselected word line shall be lower than or equal to the threshold voltage of the unselected memory cell. In addition, the word line voltage equal to the lower limit of the "10" distribution range is supplied to the control gate of the "10" verify reference cell so that the current having the current amount Iref may run through the reference cell.

Next, it is judged whether or not the threshold voltage of the selected memory cell to be programmed into "01" belongs to the "01" distribution range. Then, during the program-verify, voltage of the unselected word line shall be lower than or equal to the threshold voltage of the unselected memory cell. In addition, the word line voltage equal to the lower limit of the "01" distribution range is supplied to the control gate of the "01" verify reference cell so that the current having the current amount Iref may run through the reference cell.

Next, it is judged whether or not the threshold voltage of the selected memory cell to be programmed into "00" belongs to the "00" distribution range. Then, during the program-verify, voltage of the unselected word line shall be lower than or equal to the threshold voltage of the unselected memory cell. In addition, the word line voltage equal to the lower limit of the "00" distribution range is supplied to the control gate of the "00" verify reference cell so that the current having the current amount Iref may run through the reference cell.

If in all the selected memory cells to be programmed for respective data "11" to "00", the amount of the current running through the bit lines is less than or equal to the current amount Iref, the control circuit 31 considers that the threshold voltage of the selected memory cells belongs to the programming distribution range corresponding to the desired data value, and the program-verify action passes. On the one hand, in at least one selected memory cell, if the amount of the current running through the bit line exceeds the current amount Iref, the threshold voltage of the selected memory cell has not reached the lower limit of the programming distribution range corresponding to the desired data value, and thus the program-verify action fails (ST 58).

The programming voltage according to the corresponding programming data is applied again to the selected memory cell that failed (ST 54 to 57). Thus, the program-verify action (ST 58) and application of the programming voltage (ST 54 to 57) are repeated in the failed selected memory cell, until it is judged that the threshold voltage of the failed selected memory cell belongs to the programming distribution range corresponding to the desired data value.

As such, as information can be programmed to all memory cells to be programmed even if there still exists any memory cell from which information has been erased excessively after erasure has taken place, there is no need of programming back the information to the memory cells from which information has been erased excessively, thereby enabling accelerated writing time.

In addition, as the program verify action for judging whether or not the threshold voltage of the selected memory cell belongs to the programming distribution range corresponding to the desired data value, after the programming voltage has been applied to all the selected memory cells to be programmed in the process of step ST 58, any offset in the threshold voltage of unselected memory cells can be eliminated, thereby avoiding readout error of information.

Alternative Embodiments (1) In the embodiments described above, although programming voltage was applied in the order of data "11", "10", "01, "00", it is possible to apply the programming voltage in any order.

(2) In the embodiments described above, although the upper limit of the erasure distribution range shall be lower than the upper limit of the "11" distribution range, only by variation in threshold voltage to be given to adjacent memory cells when programming data "11" to erased memory cells, the lower limit of the erasure distribution range may be higher than the lower limit of the "00" distribution range, only by variation in the threshold voltage to be given to the adjacent memory cells when programming data "00" to the erased memory cells.

(3) In the embodiments described above, although the program-verify action is performed again only on selected memory cells that failed in the process of step ST 58, the program-verify action may be performed again on all the selected memory cells in the process of step S58.

(4) In the embodiments described above, although a case where the invention is applied to the four-valued multilevel flash memory is described, the invention could also be applied to a multilevel flash memory having arbitrary similar values.

(5) In the embodiments described above, although we used a NOR type nonvolatile memory having the floating gate structure, a NAND type nonvolatile memory may be used, for instance, and if there is provided a memory cell array having such configuration that threshold voltage of memory cells is affected by programming of adjacent memory cells, the device of this invention may be used to take countermeasures.

(6) In the embodiments described above, although MOSFET was used in the memory cells, a variable resistance element may be used in the memory cell, and if there is provided a memory cell array having such configuration that electrical attributes of memory cells is affected by programming of adjacent memory cells, the device of this invention may be used to take similar countermeasures.

(7) In the embodiments described above, before the erase gate voltage is applied to the selected memory cell arrays, it is also possible to apply to all the memory cells in the memory cell array a programming pulse (e.g., 1 µs) as preliminary programming for setting threshold voltage of the memory cells in the memory cell array higher than or equal to a certain level (e.g., the lower limit of the "10" distribution range). Specifically, while the preliminary program gate voltage (e.g., "10V") is applied to the word line to which the selected memory cell to be subjected to the preliminary programming is connected, preliminary program drain voltage (e.g., "5V") is supplied to the bit line to which the selected memory cell to be subjected to the preliminary programming is connected, and the source of the memory cell shall be set to 0V.

(8) In the embodiments described above, although the configuration is such that the erasure means and the programming means operate independently, that is, the erasure means erases the selected memory cells to be erased so that its electrical attributes may belong to the erasure distribution range, and the programming means programs the erased memory cell so that its electrical attributes may belong to any one of the programming distribution ranges, it is preferable that the configuration may be such that the erasure means erases the selected memory cells to be programmed so that its electrical attributes may belong to the erasure distribution range, and subsequently the programming means programs the erased memory cells so that its electrical attributes may belong to any one of the programming distribution ranges.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A nonvolatile semiconductor memory device having a memory cell array arranged with a plurality of memory cells capable of storing information as a result of a change in an electrical attribute and of erasing and programming information by electrically changing the electrical attribute, wherein each memory cell in the plurality of memory cells can store one data value to be selected from the same number of data values as a plurality of distribution ranges for programming which are not mutually overlapping, in accordance with that the electrical attribute belongs to one of the distribution ranges for programming, the nonvolatile semiconductor memory device comprising:

an erasure device to erase one or more memory cells from among the plurality of memory cells so that the electrical attributes of the one or more memory cells selected as targets of erasing belong to a distribution range for erasing; and a programming device to program one or more memory cells from among the plurality of memory cells so that the electrical attributes of the one or more memory cells selected as targets of programming belong to any one of the distribution ranges for programming, wherein the nonvolatile semiconductor memory device is configured so that either the upper limit of the distribution range for erasing is lower than the upper limit of the lowest distribution range, only by variation in a threshold voltage to be given to an adjacent memory cell when programming to an erased memory cell the data value corresponding to the lowest distribution range among the distribution ranges for programming, or the lower limit of the distribution range for erasing is higher than the lower limit of the highest distribution range, only by variation in a threshold voltage to be given to an adjacent memory cell when programming to an erased memory cell a data value corresponding to the highest distribution range among the distribution ranges for programming.

2. The nonvolatile semiconductor memory device according to claim 1, wherein
the erasure device is configured to erase the one or more memory cells selected as targets of programming so that their electrical attributes may belong to the distribution range for erasing before the programming device programs the one or more memory cells selected as targets of programming so that their electrical attributes may belong to any one of the distribution ranges for programming.

3. The nonvolatile semiconductor memory device according to claim 1, wherein
each of the memory cells in the plurality of memory cells have a floating gate that stores information depending on an amount of accumulated charge, a source, a drain, and a control gate that controls a potential level of the floating gate,
each of the memory cells is arranged in rows and columns as a matrix, each control gate of the memory cells on a same row is connected to a common word line, each drain of the memory cells on a same column is connected to a common bit line, and
the electrical attribute is a threshold voltage of a MOSFET included in each of the memory cells.

4. The nonvolatile semiconductor memory device according to claim 1, wherein
either an upper limit of the distribution range for erasing is lower than or equal to an upper limit of the lowest distribution range among the distribution ranges for programming, or a lower limit of the distribution range for erasing is higher than or equal to a lower limit of the highest distribution range among the distribution ranges for programming.

5. The nonvolatile semiconductor memory device according to claim 1, wherein
either a lower limit of the distribution range for erasing is lower than a lower limit of the lowest distribution range among the distribution ranges for programming, or an upper limit of the distribution range for erasing is higher than an upper limit of the highest distribution range among the distribution ranges for programming.

6. The nonvolatile semiconductor memory device according to claim 3, wherein
an upper limit of the distribution range for erasing is lower than or equal to an upper limit of the lowest distribution range among the distribution ranges for programming, and
a lower limit of the distribution range for erasing is lower than a lower limit of the lowest distribution range.

7. The nonvolatile semiconductor memory device according to claim 6, wherein
the upper limit of the distribution range for erasing is lower than the upper limit of the lowest distribution range, only by variation in threshold voltage to be given to an adjacent memory cell when programming to an erased memory cell a data value corresponding to the lowest distribution range.

8. The nonvolatile semiconductor memory device according to claim 6, wherein
the programming device is configured to perform a program-verify action for judging whether or not the threshold voltage of at least one memory cell belongs to the distribution range for programming corresponding to a desired data value after applying programming voltage to all of the memory cells being a target of programming.

9. The nonvolatile semiconductor memory device according to claim 6, wherein
the programming device is configured to repeat a program-verify action and application of the programming voltage until it is judged that the threshold voltage of the one ore more memory cells being a target of programming belong to the programming distribution range that corresponds to a desired data value.

10. The nonvolatile semiconductor memory device according to claim 6, wherein
the erasure device is configured to apply to unselected word lines to which a selected memory cell being a target of erasing is not connected a voltage that is lower than or equal to the lowest threshold voltage among the threshold voltages of unselected memory cells when an erase-verify action is performed, the unselected memory cells being memory cells, on a selected bit line to which the selected memory cell is connected, that are not a target of erasing.

11. The nonvolatile semiconductor memory device according to claim 6, wherein the programming device is configured to apply to unselected word lines to which a selected memory cell being a target of the program-verify action is not connected a voltage that is lower than or equal to the lowest threshold voltage among the threshold voltages of unselected memory cells when a program-verify action is performed, unselected memory cells being memory cells, on a selected bit line to which the selected memory cell is connected, that are not a target of the program-verify action.

12. The nonvolatile semiconductor memory device according to claim 6, wherein
the programming device is configured to apply to unselected word lines to which a selected memory cell being a target of programming is not connected a voltage that is lower than or equal to the lowest threshold voltage among the threshold voltages of unselected memory cells when programming each data value, unselected memory cells being memory cells, on a selected bit line to which the selected memory cell is connected, that are not a target of programming.

13. A nonvolatile semiconductor memory device having a memory cell array arranged with a plurality of memory cells capable of storing information as a result of a change in an threshold voltage and of erasing and programming information by electrically changing the threshold voltage, wherein each of memory cells in the plurality of memory cells can store one data value to be selected from the same number of data values as a plurality of distribution ranges for programming which are not mutually overlapping, in accordance with that the threshold voltage belongs to one of the distribution ranges for programming, the nonvolatile semiconductor memory device comprising:

an erasure device to erase one or more memory cells from among the plurality of memory cells so that the threshold voltages of the one or more memory cells selected as a targets of erasing belong to a distribution range for erasing; and a programming device to program the one or more memory cells so that the threshold voltages of the one or more memory cells selected as targets of programming belong to any one of the distribution ranges for programming, wherein each of the memory cells is arranged in rows and columns as a matrix, each control gate of the memory cells on a same row is connected to a common word line, each drain of the memory cells on a same column is connected to a common bit line, an upper limit of the distribution range for erasing is lower than or equal to an upper limit of the lowest distribution range among the distribution ranges for programming, and a lower limit of the distribution range for erasing is lower than a lower limit of the lowest distribution range, and wherein the erasure device is configured to apply to unselected word lines to which a selected memory cell being a target of erasing is not connected a voltage that is lower than or equal to the lowest threshold voltage among the threshold voltages of unselected memory cells when an erase-verify action is performed, the unselected memory cells being memory cells, on a selected bit line to which the selected memory cell is connected, that are not a target of erasing.

14. A nonvolatile semiconductor memory device having a memory cell array arranged with a plurality of memory cells capable of storing information as a result of a change in a threshold voltage and of erasing and programming information by electrically changing the threshold voltage, wherein each memory cell in the plurality of memory cells can store one data value to be selected from the same number of data values as a plurality of distribution ranges for programming which are not mutually overlapping, in accordance with that the threshold voltage belongs to one of the distribution ranges for programming, the nonvolatile semiconductor memory device comprising:

an erasure device to erase one or more memory cells from among the plurality of memory cells so that the threshold voltages of the one or more memory cells selected as a targets of erasing belong to a distribution range for erasing; and a programming device to program one or more memory cells from among the plurality of memory cells so that the threshold voltages of the one ore more memory cells being a target of programming belong to any one of the distribution ranges for programming, wherein each of the memory cells is arranged in rows and columns as a matrix, each control gate of the memory cells on a same row is connected to be common word line, each drain of the memory cells on a same column is connected to a common bit line, an upper limit of the distribution range for erasing is lower than or equal to an upper limit of the lowest distribution range among the distribution ranges for programming, and a lower limit of the distribution range for erasing is lower than a lower limit of the lowest distribution range, and wherein the programming device is configured to apply to unselected words lines to which a selected memory cell being a target of the program-verify action is not connected a voltage that is lower than or equal to the lowest threshold voltage among the threshold voltages of unselected memory cells when a program-verify action is performed, the unselected memory cells being memory cells, on a selected bit line to which the selected memory cell is connected, that are not a target of the program-verify action.

15. A nonvolatile semiconductor memory device having a memory cell array arranged with a plurality of memory cells capable of storing information as a result of a change in a threshold voltage and of erasing and programming information by electrically changing the threshold voltage, wherein each memory cell in the plurality of memory cells can store one data value to be selected from the same number of data values as a plurality of distribution ranges for programming which are not mutually overlapping, in accordance with that the threshold voltage belongs to one of the distribution ranges for programming, the nonvolatile semiconductor memory device comprising:

an erasure device to erase one or more memory cells from among the plurality of memory cells so that the threshold voltages of the one or more memory cells selected as targets of erasing belong to a distribution range for erasing; and a programming device to program one or more memory cells from among the plurality of memory cells so that the threshold voltages of the one or more memory cells selected as targets of programming belong to any one of the distribution ranges for programming wherein, each of the memory cells is arranged in rows and columns as a matrix, each control gate of the memory cells on a same row is connected to be common word line, each drain of the memory cells on a same column is connected to a common bit line, an upper limit of the distribution range for erasing is lower than or equal to an upper limit of the lowest distribution range among the distribution ranges for programming, and a lower limit of the distribution range for erasing is lower than a lower limit of the lowest distribution range, and wherein the programming device is configured to apply to unselected word lines to which a selected memory cell being a target of programming is not connected a voltage that is lower than or equal to the lowest threshold voltage among the threshold voltages of unselected memory cells when programming each data value, unselected memory cells being memory cells, on a selected bit line to which the selected memory cell is connected, that are not a target of programming.

* * * * *